(12) United States Patent
Arnz et al.

(10) Patent No.: US 8,260,033 B2
(45) Date of Patent: Sep. 4, 2012

(54) METHOD AND APPARATUS FOR DETERMINING THE RELATIVE OVERLAY SHIFT OF STACKED LAYERS

(75) Inventors: Michael Arnz, Oberkochen (DE); Gerd Klose, Oberkochen (DE)

(73) Assignee: Carl Zeiss SMS GmbH, Jena (DE)

( * ) Notice: Subject to any disclaimer, the term of this patent is extended or adjusted under 35 U.S.C. 154(b) by 400 days.

(21) Appl. No.: 12/599,127

(22) PCT Filed: Mar. 7, 2008

(86) PCT No.: PCT/EP2008/001844
§ 371 (c)(1),
(2), (4) Date: Mar. 3, 2010

(87) PCT Pub. No.: WO2008/145210
PCT Pub. Date: Dec. 4, 2008

(65) Prior Publication Data
US 2010/0208935 A1    Aug. 19, 2010

Related U.S. Application Data

(60) Provisional application No. 60/940,202, filed on May 25, 2007.

(51) Int. Cl.
*G06K 9/00* (2006.01)
(52) U.S. Cl. .......... 382/144; 438/122; 430/22; 430/30; 382/278; 356/401
(58) Field of Classification Search .............. 382/144; 356/399–401
See application file for complete search history.

(56) References Cited

U.S. PATENT DOCUMENTS
5,434,956 A * 7/1995 Son et al. .............. 358/1.5
(Continued)

FOREIGN PATENT DOCUMENTS
DE    103 37 767    3/2005

OTHER PUBLICATIONS
International Search Report for International Application No. PCT/EP2008/001844 dated Jun. 12, 2008.

*Primary Examiner* — Tarifur Chowdhury
*Assistant Examiner* — Isiaka Akanbi
(74) *Attorney, Agent, or Firm* — Fish & Richardson P.C.

(57) ABSTRACT

A method is provided for determining the relative overlay shift of stacked layers, said method comprising the steps of: a) providing a reference image including a reference pattern that comprises first and second pattern elements; b) providing a measurement image of a measurement pattern, which comprises a first pattern element formed by a first one of the layers and a second pattern element formed by a second one of the layers; c) weighting the reference or measurement image such that a weighted first image is generated, in which the first pattern element is emphasized relative to the second pattern element; d) determining the relative shift of the first pattern element on the basis of the weighted first image and of the measurement or reference image not weighted in step c); e) weighting the reference or measurement image such that a weighted second image is generated, in which the second pattern element is emphasized relative to the first pattern element; f) determining the relative shift of the second pattern element on the basis of the weighted second image and of the measurement or reference image not weighted in step e); g) determining the relative overlay shift on the basis of the relative shifts determined in steps d) and f).

11 Claims, 6 Drawing Sheets

U.S. PATENT DOCUMENTS

| | | | |
|---|---|---|---|
| 5,489,986 A * | 2/1996 | Magome et al. | 356/401 |
| 6,023,338 A * | 2/2000 | Bareket | 356/401 |
| 7,387,859 B2 | 6/2008 | Gerlach | |
| 2002/0001083 A1 | 1/2002 | Tabei | |
| 2002/0199164 A1 | 12/2002 | Sengupta et al. | |
| 2004/0038455 A1 | 2/2004 | Seligson et al. | |
| 2005/0037270 A1 | 2/2005 | Gerlach | |
| 2005/0195398 A1 * | 9/2005 | Adel et al. | 356/401 |

* cited by examiner

METHOD AND APPARATUS FOR DETERMINING THE RELATIVE OVERLAY SHIFT OF STACKED LAYERS

This application is the National Stage of International Application No. PCT/EP2008/001844, filed on Mar. 7, 2008, which claims priority to U.S. Provisional Patent Application Ser. No. 60/940,202, filed on May 25, 2007. The contents of these applications are hereby incorporated by reference in their entireties.

The present invention relates to a method and to an apparatus for determining the relative overlay shift of stacked layers.

Such a method is described, for example, in US 2005/0037270 A1, wherein two measurement patterns are recorded, each measurement pattern including a first pattern element formed by a first one of the stacked layers and a second pattern formed by a second one of the stacked layers. Both images are subsequently compared, which involves searching the corresponding pattern element for each layer, separating said pattern element and then determining the position of the pattern elements in the plane, in order to derive the overlay shift therefrom.

In view thereof, it is an object of the invention to provide a method for determining the relative overlay shift of stacked layers, said method being easy to carry out and providing higher accuracy. Further, a corresponding apparatus for determining the relative overlay shift of stacked layers is to be provided.

The object is achieved by a method for determining the relative overlay shift of stacked layers, said method comprising the steps of:
a) providing a reference image including a reference pattern that comprises first and second pattern elements;
b) providing a measurement image of a measurement pattern, which comprises a first pattern element formed by a first one of the stacked layers and a second pattern element formed by a second one of the stacked layers;
c) weighting the reference or measurement image such that a weighted first image is generated, in which the first pattern element is emphasized relative to the second pattern element;
d) determining the relative shift of the first pattern element on the basis of the weighted first image and of the measurement or reference image not weighted in step c);
e) weighting the reference or measurement image such that a weighted second image is generated, in which the second pattern element is emphasized relative to the first pattern element;
f) determining the relative shift of the second pattern element on the basis of the weighted second image and of the measurement or reference image not weighted in step e);
g) determining the relative overlay shift on the basis of the relative shifts determined in steps d) and f).

Due to said weighting, it is no longer required to separate the pattern elements of both layers in the reference image and in the measurement image. Also, due to the method according to the invention, it is no longer required to determine the absolute position of the pattern elements, which allows to reduce the noise-induced error of measurement. Thus, by the method according to the invention, the desired relative overlay shift can be determined very quickly.

Further, the determination of the relative shift can be carried out by cross-correlation in at least one of the steps d) and f). In combination with the weighting in steps c) and e), this has led to the advantage of higher accuracy, because said weighting prevents crosstalk between the various local maxima of the cross-correlation matrix.

In particular, the determination of the relative shift can be carried out iteratively in at least one of the steps d) and f). This leads to a further increase in accuracy.

It is particularly advantageous to weight the reference image in each of the steps c) and e).

In particular, the reference image can be a measurement image of a measurement pattern. It is also possible to determine the reference image from the design data of the stacked layers.

The stacked layers may be, in particular, layers of a lithographic mask or of a semiconductor wafer.

There is further provided an apparatus for determining the relative overlay shift of stacked layers, which apparatus comprises an evaluating module carrying out the following steps:
A) providing a reference image including a reference pattern that comprises first and second pattern elements;
B) providing a measurement image of a measurement pattern, which comprises a first pattern element formed by a first one of the stacked layers and a second pattern element formed by a second one of the stacked layers;
C) weighting the reference or measurement image such that a weighted first image is generated, in which the first pattern element is emphasized relative to the second pattern element;
D) determining the relative shift of the first pattern element on the basis of the weighted first image and of the measurement or reference image not weighted in step C);
E) weighting the reference or measurement image such that a weighted second image is generated, in which the second pattern element is emphasized relative to the first pattern element;
F) determining the relative shift of the second pattern element on the basis of the weighted second image and of the measurement or reference image not weighted in step E);
G) determining the relative overlay shift on the basis of the relative shifts determined in steps D) and F).

This apparatus allows to quickly and accurately determine the relative overlay shift.

When determining the relative shift, the evaluation module may carry out a cross-correlation in at least one of the steps D) and F). This allows to carry out an extremely exact determination of the relative overlay shift.

A further increase in accuracy is possible due to the evaluating module carrying out the determination of the relative shift iteratively in at least one of the steps D) and F).

Further, the evaluating module may weight the reference image in each of the steps C) and E).

In particular, it is possible for the evaluating module to provide a measurement image of a measurement pattern as the reference image in step A). However, it is also possible for the reference image to be derived from design data of the stacked layers. The stacked layers may be, in particular, layers of a lithographic mask for semiconductor production or of a semiconductor wafer.

It will be appreciated that the aforementioned features and those still to be explained below can be employed not only in the combinations set forth herein, but also in other combinations, or alone, without departing from the scope of the present invention.

The invention will be explained in more detail below, by way of example and with reference to the enclosed drawings, which also disclose essential features of the invention and wherein.

Figure 1:
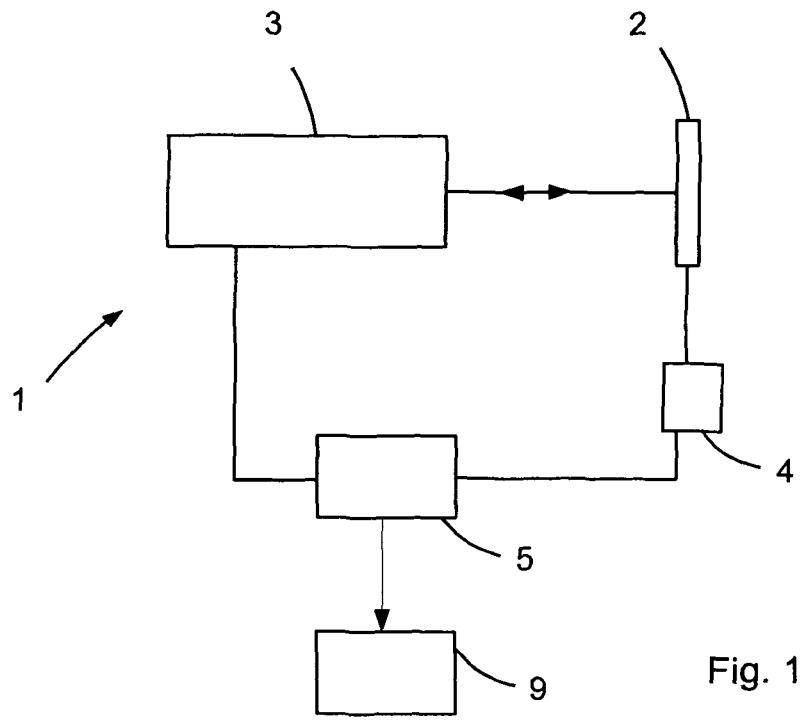
FIG. 1 shows a schematic view of a measurement apparatus 1 comprising one embodiment of the evaluating device 9.

FIG. 1 schematically shows a measurement apparatus 1 for measuring a lithographic mask 2. The measurement apparatus 1 comprises a recording device 3, by which portions of the lithographic mask 2 can be recorded in enlarged form; a positioning device 4, which can adjust the position or location, respectively, of the lithographic mask 2 relative to the recording device 3 in a controlled manner, as well as a control device 5 for controlling the measurement apparatus 1.

Figure 2:
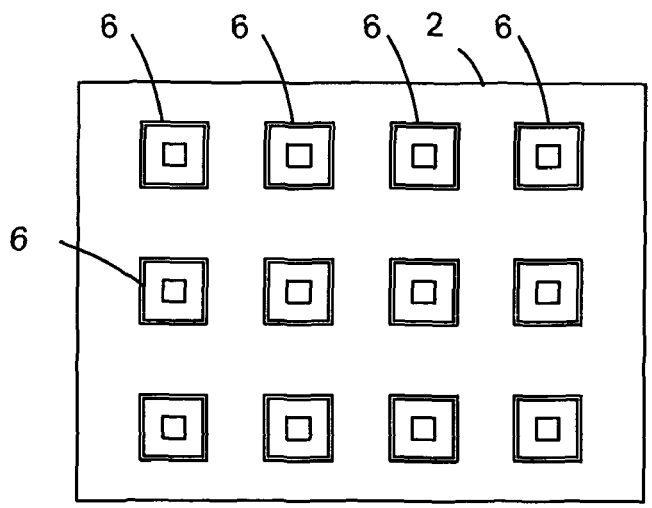
FIG. 2 shows a top view of the lithographic mask 2 of FIG. 1.

FIG. 2 schematically shows a top view of the lithographic mask. The lithographic mask 2 contains a multiplicity of measurement patterns 6, which are not drawn to scale, but considerably enlarged, in FIG. 2. Between the measurement patterns 6, there are further mask structures relevant to exposure, which are omitted here for easier illustration.

Figure 3:
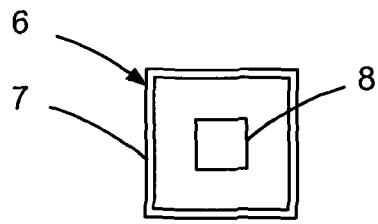
FIG. 3 shows an enlarged view of a measurement pattern 6 of the lithographic mask 2.

FIG. 3 shows one of the measurement patterns 6 still further enlarged. As is evident, in particular, from FIG. 3, the measurement pattern 6 comprises a frame 7 (first pattern element), which is formed in a first layer of the multi-layer lithographic mask 2. Further, the measurement pattern 6 contains an inner square 8 (second pattern element), which is formed in a second layer stacked on the first layer. Using these measurement patterns, it is possible, as will be described in more detail below, to determine the shift of both layers relative to each other (also called overlay shift).

In order to determine the overlay shift, the measurement patterns 6 are sequentially recorded by the recording device 3, with the positioning device 4 moving and positioning, for each recording, the lithographic mask 2 with high precision relative to the recording device 3, which may comprise, for example, a CCD detector (not shown) for image sensing. The image data of the individual recorded images are supplied to the control unit 5 which transmits these data to an evaluating device 9 according to the invention.

Figure 4:
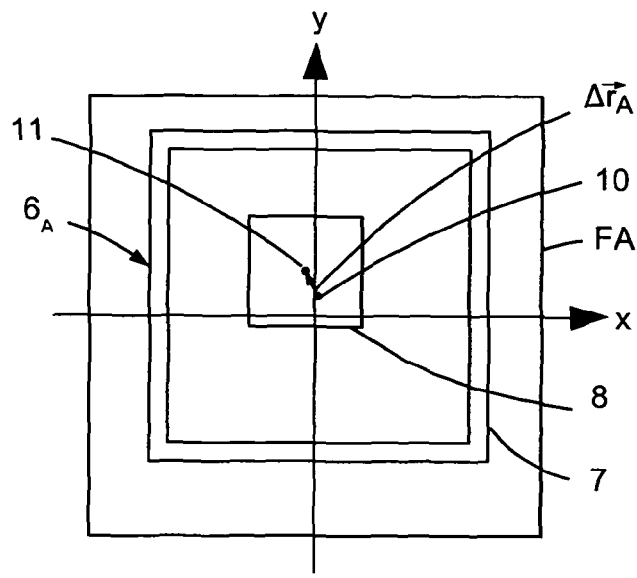
FIG. 4 shows an enlarged recorded image of a first measurement pattern $6_A$.
Figure 5:
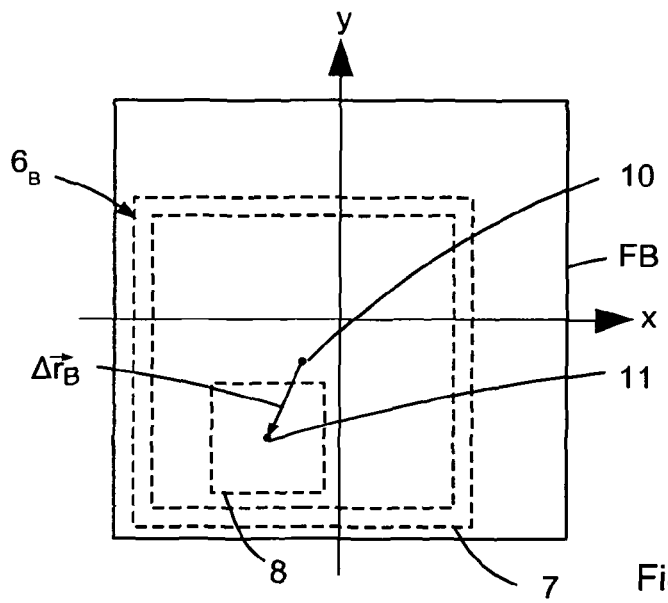
FIG. 5 shows an enlarged recorded image of a second measurement pattern $6_B$.

FIG. 4 is an enlarged view of the recorded image F1 of a first measurement pattern $6_A$, and FIG. 5 shows an enlarged view of the recorded image F2 of a second measurement pattern $6_B$. In order to be able to better distinguish the measurement patterns $6_A$ and $6_B$, the measurement pattern $6_B$ is shown in dashed lines. Further, with reference to the respective centers 10, 11 of the frame 7 and of the square 8, the offset of the centers 10 and 11 is shown by the shift vectors $\Delta \vec{r}_A$ (FIG. 4) and $\Delta \vec{r}_B$ (FIG. 5).

The centers 10 and 11 of the frame 7 and of the square 8 are indicated in FIGS. 4 and 5 as well as in all subsequent Figures merely to explain the existing shift and are not part of the actual measurement patterns 6. Further, for easier description, the measurement patterns are assumed to be shifted only in the x- and y-directions, but not rotated.

Figure 6:
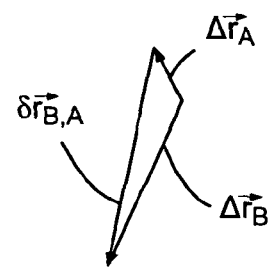
FIG. 6 shows a view explaining the relative overlay shift $\delta \vec{r}_{B,A}$.

As indicated in FIGS. 4 and 5, it is extremely difficult to position the lithographic mask 2 such that the center of the recording field FA, FB (indicated by the point of intersection of the two axes x, y) coincides with the center 10 of the frame 7. However, this undesired offset is generally not of interest here. Rather, the change in overlay shift is to be determined, i.e. how the position of the inner square 8 relative to the frame 7 changes. This change thus corresponds to the difference $\Delta \vec{r}_B - \Delta \vec{r}_A$ and will be referred to below as relative overlay shift $\delta \vec{r}_{B,A}$ (which corresponds to the relative shift of both layers of the lithographic mask 2). The relative overlay shift $\delta \vec{r}_{B,A}$ is shown in an enlarged view in FIG. 6. In order to determine this relative overlay shift $\delta \vec{r}_{B,A}$, the evaluating device 9 carries out the evaluating method described below.

Figure 7:
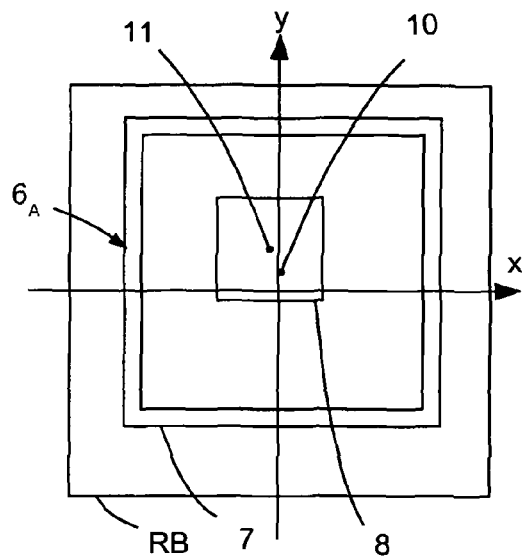
FIG. 7 shows a view of the reference image RB.

First of all, one of the two recorded images of FIGS. 4 and 5 is defined as the reference image RB. Since the absolute deviations in the recorded image of FIG. 4 are smaller than in FIG. 5, the recorded image of FIG. 4 is selected as the reference image RB (FIG. 7). This selection may be carried out automatically by the evaluating device, using known pattern recognition methods, for example.

Figure 8:
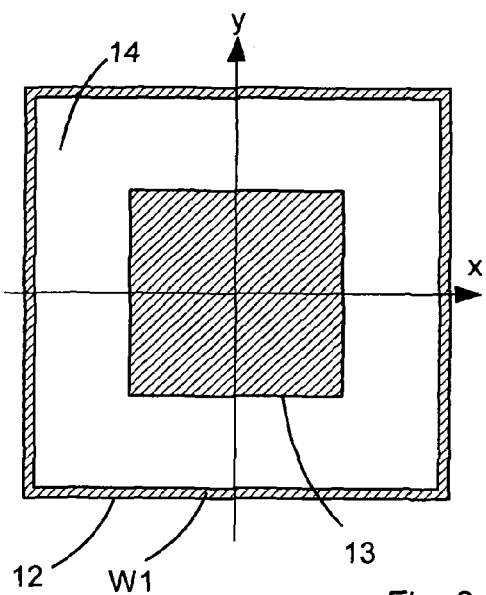
FIG. 8 shows a view of the first weighting W1.

The reference image RB is weighted using the weighting W1 schematically shown in FIG. 8, said weighting W1 being mathematically applied to the reference image RB. The weighting W1 is predetermined such that those areas of the reference image RB which coincide with the cross-hatched areas 12 and 13 are suppressed in the reference image RB, and those areas which coincide with the frame area 14 located between the cross-hatched areas 12 and 13 are not modified. This generates a weighted first reference image RB1 (FIG. 9), in which substantially only the frame $7_A$ is still present (elements of the weighted first reference image RB1 are referred to by the index 1). Thus, the frame 7 has been emphasized as compared to the inner square 8. In this case, those areas in the weighted first reference image RB1 which coincide with the cross-hatched areas 12 and 13 of the weighting W1 have been set to a suitable color value or to suitable color values, so that in the weighted first reference image RB1 the inner square 8 is no longer present and at the same time, if possible, no additional discontinuities in the color distribution are introduced. The color distribution may be, in particular, a gray-scale distribution.

Figure 10:
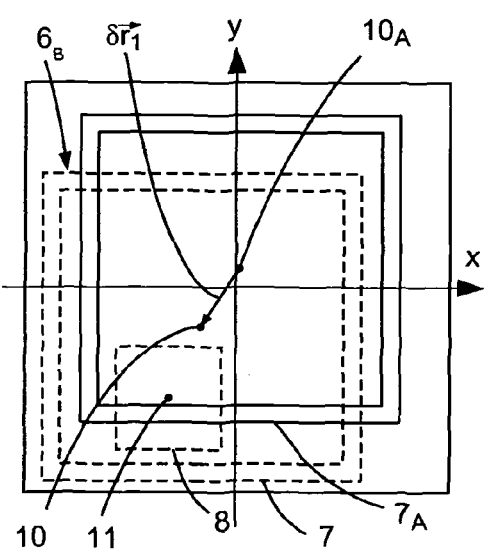
FIG. 10 shows a view explaining the cross-correlation to be carried out in order to determine the relative shift of the frames 7.

As indicated in FIG. 10, a cross-correlation is carried out between the weighted first reference image RB1 and the measurement image of FIG. 5 in order to determine the shift of the center $10_A$ of the frame $7_A$ of the first weighted reference image RB1 relative to the center 10 of the frame 7 of the measurement image $6_B$. This shift is indicated in FIG. 10 as arrow $\delta \vec{r}_1$.

Figure 11:
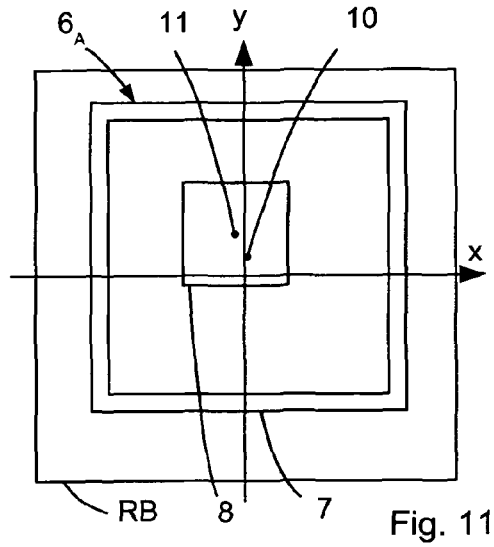
FIG. 11 shows a view of the reference image RB.
Figure 12:
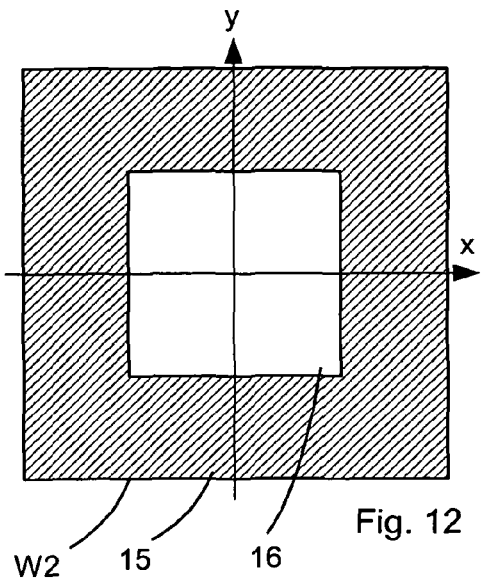
FIG. 12 shows a view of the second weighting W2.
Figure 13:
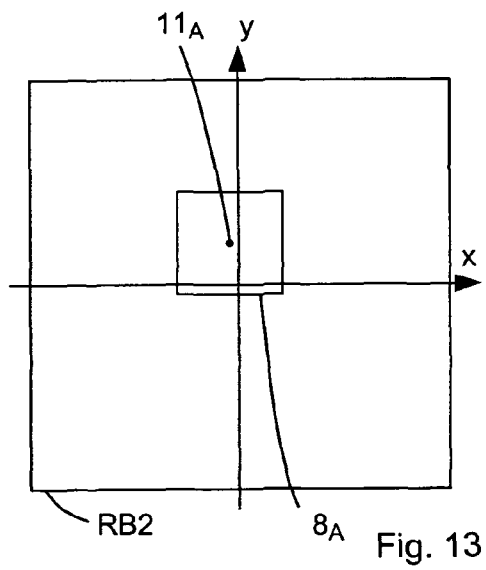
FIG. 13 shows a view of the weighted second reference image RB2.

In a next step, the reference image RB (FIG. 11) is weighted by the weighting W2 (FIG. 12), said weighting W2 being mathematically applied to the reference image RB. The weighting W2 differs from the weighting W1 in that the inner square 8 is now emphasized relative to the frame 7. For this purpose, the cross-hatched area 15 is selected such that corresponding areas of the reference image RB are set to a suitable color value or to suitable color values and, again, no additional discontinuities in the color distribution (e.g. the grayscale distribution) are introduced, if possible. The square inner area 16 surrounded by the cross-hatched area 15 is selected such that image data of the reference image RB, which coincide with this area 16, are not modified in the reference image RB. Thus, a weighted second reference image RB2 (FIG. 13) is generated (elements of the weighted second reference image RB2 are referred to by the index 2).

Figure 14:
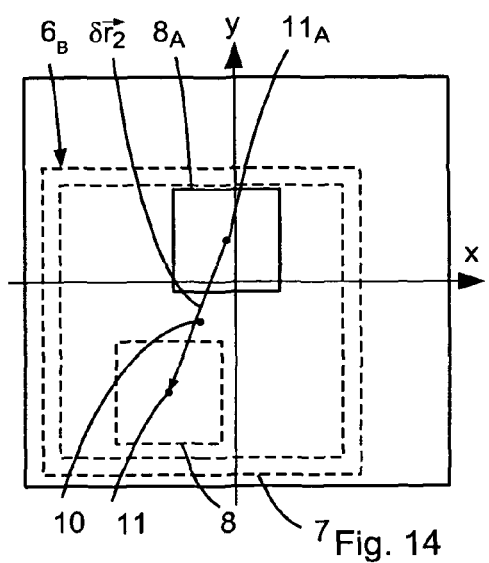
FIG. 14 shows a view explaining the cross-correlation to be carried out in order to determine the shift of the squares 8.

Using a cross-correlation between the weighted second reference image RB2 and the measurement image $6_B$, the shift of the center $11_A$ of the inner square $8_A$ of the weighted second reference image RB2 relative to the inner square 8 of the measurement image $6_B$ is determined. This shift is shown in FIG. 14 as arrow $\delta\vec{r}_2$.

Figure 15:
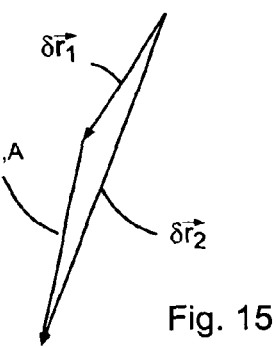
FIG. 15 shows a view of the determination of the relative overlay shift $\delta \vec{r}_{B,A}$.

As shown in an enlarged view in FIG. 15, the difference of these determined relative shifts, $\delta\vec{r}_2 - \delta\vec{r}_1$, equals the desired relative overlay shift $\delta\vec{r}_{B,A}$.

Thus, the desired relative overlay shift $\delta\vec{r}_{B,A}$ can be determined from two images without an absolute measurement.

The described steps for determining the relative shifts $\delta\vec{r}_1$ and $\delta\vec{r}_2$ may be carried out in reverse order (first $\delta\vec{r}_2$ and then $\delta\vec{r}_1$ is determined) or at the same time.

The reference image RB need not be a measurement image. It is also possible for the reference image to be generated from the design data for the lithographic mask 2 to be inspected.

Further, it is possible to generate the reference image RB, for example, by averaging a multiplicity of recorded measurement images.

Figure 16:
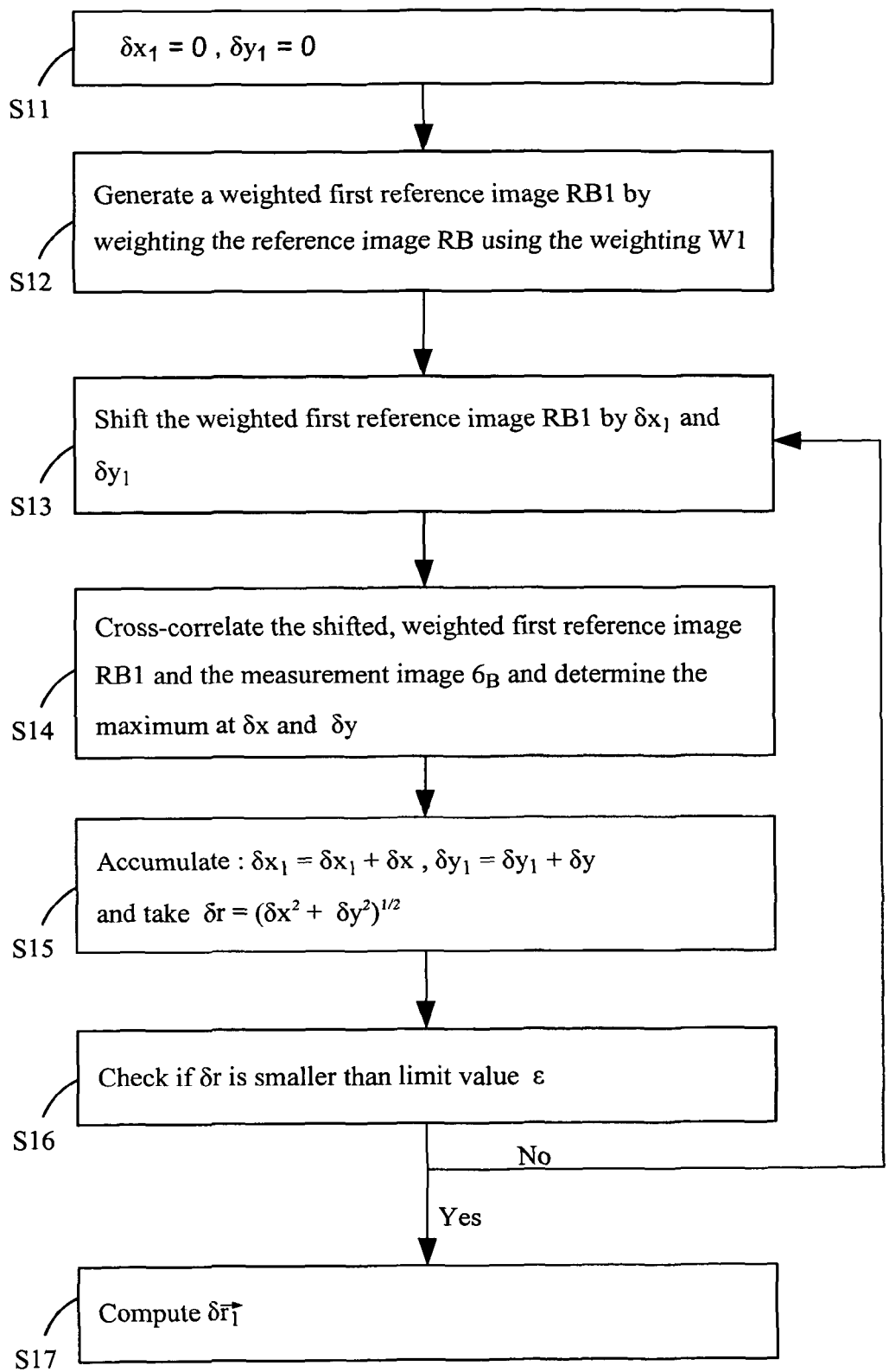
FIG. 16 shows a flowchart explaining the iterative determination of the shift $\delta \vec{r}_1$ of the frames 7.
Figure 17:
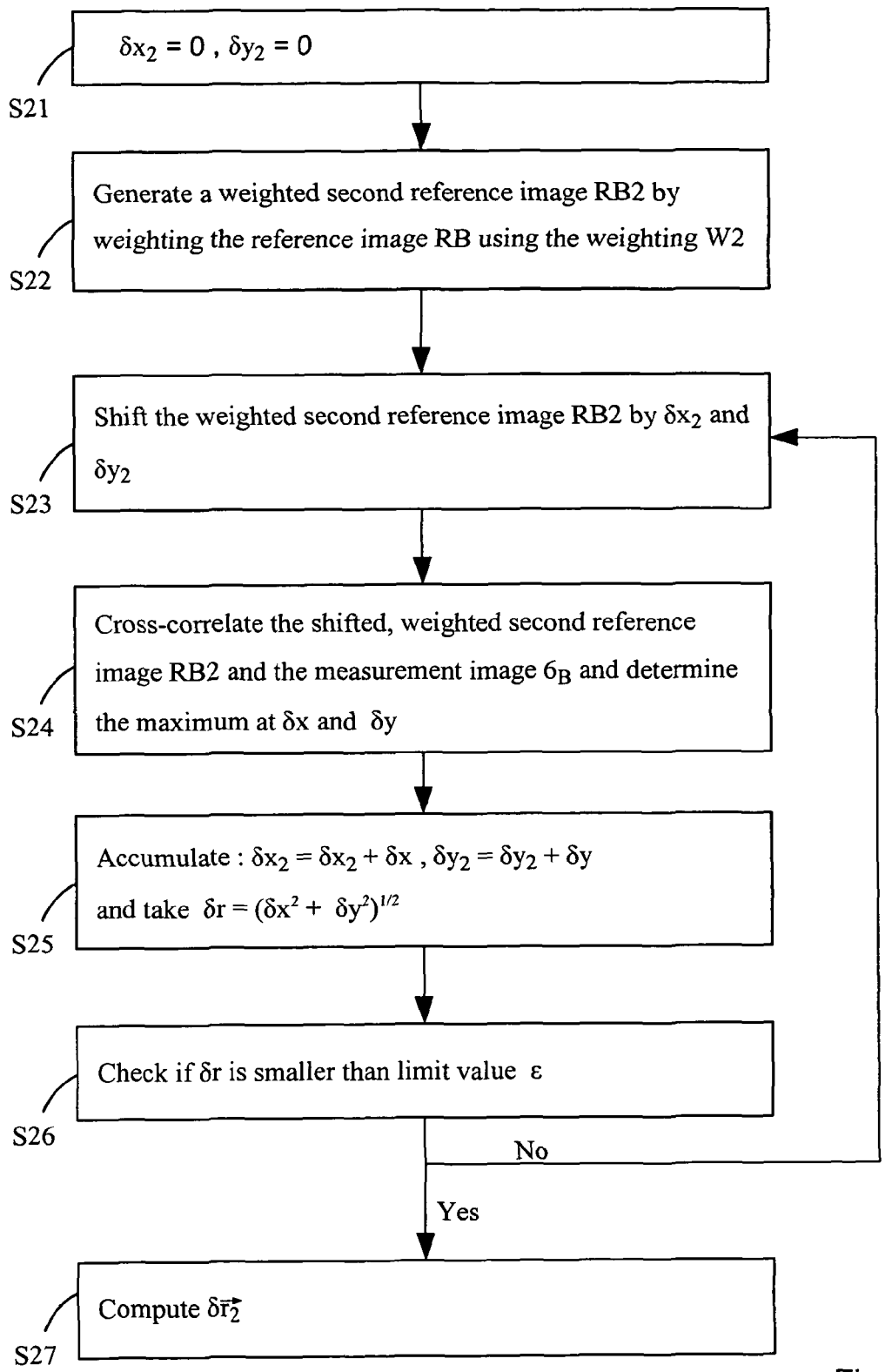
FIG. 17 shows a flowchart explaining the iterative determination of the shift $\delta \vec{r}_2$ of the inner squares 8.

For increased accuracy, the described method may also be carried out iteratively, which will be described below in connection with FIGS. 16 and 17.

First of all, in step S11 (FIG. 16), the shifts $\delta x_1$ and $\delta y_1$ to be carried out in the x- and y-directions of the weighted first reference image RB1 will be set to zero.

Figure 9:
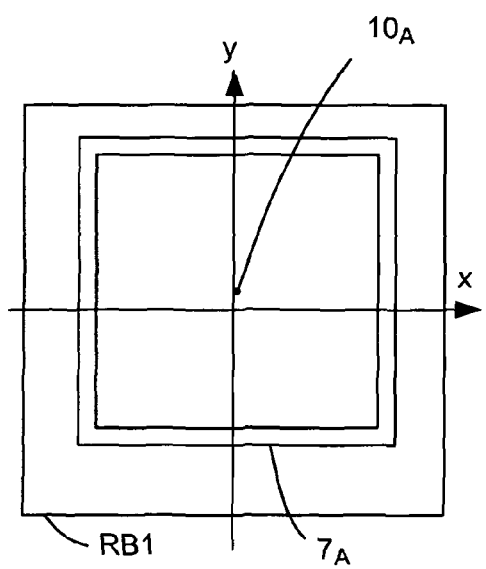
FIG. 9 shows a view of the weighted first reference image RB1.

Then, the weighted first reference image RB1 is generated in step S12 (in the same manner as described in connection with FIGS. 7 to 9).

In the following step S13 the weighted first reference image RB1 is intrinsically shifted by $\delta x_1$ in the x-direction and by $\delta y_1$ in the y-direction. An intrinsic shift is understood here such that any image information pushed over the image boundary by said shift is pushed back into the image on the opposite side of the image boundary. For example, if a portion of the image is pushed over the right-hand side of the image boundary, said portion of the image will be pushed back into the image again from the left-hand side of the image boundary.

This is followed by a cross-correlation between the shifted, weighted first reference image RB1 and the measurement image $6_B$ (step S14). The values of $\delta x$ and $\delta y$ at which the cross-correlation reaches a maximum (=best correlation) are determined and are added to the existing values $\delta x_1$ and $\delta y_1$ in step S15. Further, the shifting length $\delta r$ is also computed.

In step S16, it is verified whether the shifting length $\delta r$ is smaller than a predetermined limit value $\epsilon$. If this is not the case, the method will be continued in step S13. However, if the shifting length $\delta r$ is smaller than the limit value, the method will be continued in step S17, in which the shifting vector $\delta\vec{r}_1$ is computed.

The shifting vector $\delta\vec{r}_2$ may also be likewise determined in an iterative manner. FIG. 17 shows the corresponding steps S21-S27. The limit value $\epsilon$ in step S26 may be equal to or different from the limit value $\epsilon$ in step S16.

The desired relative overlay shift $\delta\vec{r}_{B,A}$ can then be derived from the relative shifts $\delta\vec{r}_1$ and $\delta\vec{r}_2$ thus determined in an iterative manner. The iterative method allows the relative overlay shift to be determined with greater precision.

Figure 18:
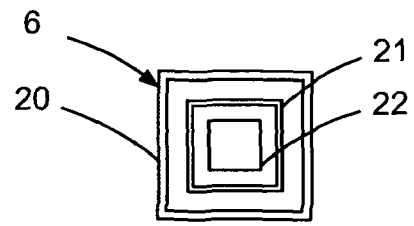
FIG. 18 shows a further embodiment of a measurement pattern 6 for three stacked layers.

Further, the method is applicable to measurement patterns which comprise structures formed by more than two layers. FIG. 18 shows an example including three layers. This measurement pattern 6 contains an outer frame 20 formed by a first layer, an inner frame 21 formed by a second layer stacked on the first layer, and an inner square 22 formed by a third layer stacked on the second layer. Weighting of the reference image is then carried out such that only one element (outer frame 20, inner frame 21 or inner square 22) is emphasized and the other elements are suppressed. The corresponding relative shift of the elements can then be determined by cross-correlation, and the relative overlay shifts of the individual layers can then be determined from said relative shifts.

Of course, the pattern elements of the measurement patterns 6 need not be provided as frames and a square. It is also possible to use any other geometric shapes from which the relative shifts for determining the relative overlay shift can be determined. In particular, the pattern elements may be provided as an n-sided polygon (e.g. a regular polygon).

Further, the method according to the invention also allows to determine a relative rotation of the pattern elements and, thus, of the layers.

The measurement pattern may be provided separately for determining the relative overlay shift in the lithographic mask and may not serve to generate a structure on the wafer during exposure of the wafer. However, those mask structures of the lithographic mask which serve to generate the structures on the wafer may also be used as measurement patterns straight away.

The invention claimed is:

1. A method for determining the relative overlay shift of stacked layers, said method comprising the steps of:
   a) providing a reference image including a reference pattern that comprises first and second pattern elements;
   b) providing a measurement image of a measurement pattern, which comprises a first pattern element from a first one of the layers and a second pattern element from a second one of the layers;
   c) weighting the reference or measurement image such that a weighted first image is generated, in which the first pattern element is emphasized relative to the second pattern element;
   d) determining the relative shift of the first pattern element on the basis of the weighted first image and of the measurement or reference image not weighted in step c);
   e) weighting the reference or measurement image such that a weighted second image is generated, in which the second pattern element is emphasized relative to the first pattern element;
   f) determining the relative shift of the second pattern element on the basis of the weighted second image and of the measurement or reference image not weighted in step e);

g) determining the relative overlay shift on the basis of the relative shifts determined in steps d) and f).

2. The method as claimed in claim 1, wherein the determination of the relative shift is carried out by cross-correlation in at least one of the steps d) and f).

3. The method as claimed in claim 2, wherein the determination of the relative shift is carried out iteratively in at least one of the steps d) and f).

4. The method as claimed in claim 2, wherein the reference image is weighted in each of the steps c) and e).

5. The method as claimed in claim 2, wherein a measurement image of a measurement pattern is provided as the reference image in step a).

6. The method as claimed in claim 1, wherein the determination of the relative shift is carried out iteratively in at least one of the steps d) and f).

7. The method as claimed in claim 6, wherein the reference image is weighted in each of the steps c) and e).

8. The method as claimed in claim 6, wherein a measurement image of a measurement pattern is provided as the reference image in step a).

9. The method as claimed in claim 1, wherein the reference image is weighted in each of the steps c) and e).

10. The method as claimed in claim 9, wherein a measurement image of a measurement pattern is provided as the reference image in step a).

11. The method as claimed in claim 1, wherein a measurement image of a measurement pattern is provided as the reference image in step a).

* * * * *